(12) United States Patent
Wood et al.

(10) Patent No.: US 9,515,011 B2
(45) Date of Patent: Dec. 6, 2016

(54) OVER-MOLD PLASTIC PACKAGED WIDE BAND-GAP POWER TRANSISTORS AND MMICS

(71) Applicant: Cree, Inc., Durham, NC (US)

(72) Inventors: Simon Wood, Raleigh, NC (US); James W. Milligan, Cary, NC (US); Chris Hermanson, Durham, NC (US)

(73) Assignee: Cree, Inc., Durham, NC (US)

(*) Notice: Subject to any disclaimer, the term of this patent is extended or adjusted under 35 U.S.C. 154(b) by 62 days.

(21) Appl. No.: 14/289,334

(22) Filed: May 28, 2014

(65) Prior Publication Data

US 2015/0348886 A1    Dec. 3, 2015

(51) Int. Cl.
| | |
|---|---|
| *H01L 23/34* | (2006.01) |
| *H01L 23/495* | (2006.01) |
| *H01L 23/29* | (2006.01) |
| *H01L 23/31* | (2006.01) |
| *H01L 23/433* | (2006.01) |
| *H01L 23/66* | (2006.01) |

(52) U.S. Cl.
CPC ....... *H01L 23/49562* (2013.01); *H01L 23/293* (2013.01); *H01L 23/3107* (2013.01); *H01L 23/4334* (2013.01); *H01L 23/66* (2013.01); *H01L 2224/32245* (2013.01); *H01L 2224/48091* (2013.01); *H01L 2224/48247* (2013.01); *H01L 2224/73265* (2013.01); *H01L 2924/181* (2013.01)

(58) Field of Classification Search
CPC ........... H01L 23/495; H01L 21/02458; H01L 21/0254; H01L 33/007; H01L 29/2003; H01L 33/32
See application file for complete search history.

(56) References Cited

U.S. PATENT DOCUMENTS

| | | | |
|---|---|---|---|
| 5,028,741 A | 7/1991 | Sanders | |
| 5,162,400 A | 11/1992 | Shiobara | |
| 5,166,228 A | 11/1992 | Shiobara | |
| 5,177,140 A * | 1/1993 | Ogawa | B22C 1/2233 |
| | | | 524/430 |
| 5,475,040 A | 12/1995 | Jamison | |
| 5,477,188 A | 12/1995 | Chawla | |
| 5,965,663 A | 10/1999 | Hayase | |
| 5,998,509 A | 12/1999 | Hayase | |

(Continued)

FOREIGN PATENT DOCUMENTS

| | | |
|---|---|---|
| JP | 2000-022049 A | 1/2000 |
| WO | WO 2013/136685 A1 | 9/2013 |

OTHER PUBLICATIONS

International Search Report and Written Opinion Corresponding to International Application No. PCT/US2015/032418; Date of Mailing: Sep. 16, 2015; 9 Pages.

(Continued)

*Primary Examiner* — Daniel Luke
*Assistant Examiner* — Khatib Rahman
(74) *Attorney, Agent, or Firm* — Myers Bigel, P.A.

(57) ABSTRACT

A transistor package includes a lead frame, a wide band-gap transistor attached to the lead frame, and an over-mold surrounding the lead frame and the wide band-gap transistor. The wide band-gap transistor has a peak output power greater than 150 W when operated at a frequency up to 3.8 GHz. Using an over-mold along with a wide band-gap transistor in the transistor package allows the transistor package to achieve an exceptionally high efficiency, gain, and bandwidth, while keeping the manufacturing cost of the transistor package low.

24 Claims, 13 Drawing Sheets

(56) References Cited

U.S. PATENT DOCUMENTS

| | | | |
|---|---|---|---|
| 6,281,574 B1* | 8/2001 | Drake | H01L 23/3732 257/706 |
| 6,384,472 B1 | 5/2002 | Huang | |
| 6,531,931 B1 | 3/2003 | Benyamin | |
| 6,632,704 B2 | 10/2003 | Kumamoto | |
| 6,822,321 B2 | 11/2004 | Crescenzi, Jr. | |
| 6,980,055 B2 | 12/2005 | Gharpurey | |
| 7,135,720 B2 | 11/2006 | Nagy | |
| 8,076,994 B2 | 12/2011 | Farrell et al. | |
| 8,330,265 B2 | 12/2012 | Farrell et al. | |
| 8,592,966 B2 | 11/2013 | Wood et al. | |
| 2003/0023007 A1* | 1/2003 | Reardon | C07D 265/26 525/430 |
| 2005/0051358 A1* | 3/2005 | Kawamoto | H05K 3/3452 174/260 |
| 2006/0029811 A1 | 2/2006 | Sugioka et al. | |
| 2006/0157831 A1 | 7/2006 | Ano | |
| 2006/0214153 A1 | 9/2006 | Ikezawa et al. | |
| 2006/0226525 A1 | 10/2006 | Osuga | |
| 2007/0268073 A1* | 11/2007 | Suzaki | H03F 1/56 330/295 |
| 2007/0277375 A1* | 12/2007 | Takano | B32B 27/04 29/846 |
| 2007/0278532 A1* | 12/2007 | Kosaki | H01L 29/66462 257/214 |
| 2009/0096074 A1 | 4/2009 | Kimura | |
| 2010/0200890 A1 | 8/2010 | Tomiyama | |
| 2010/0224970 A1 | 9/2010 | Powell et al. | |
| 2011/0014834 A1* | 1/2011 | Yi | B29C 70/10 442/71 |
| 2011/0309530 A1 | 12/2011 | Shen et al. | |
| 2012/0218025 A1 | 8/2012 | Honea | |
| 2013/0015924 A1 | 1/2013 | Andre et al. | |
| 2013/0082785 A1 | 4/2013 | Afshari | |
| 2013/0256894 A1* | 10/2013 | Adema | H01L 24/83 257/762 |
| 2013/0289156 A1* | 10/2013 | Hayashi | C08J 3/14 522/168 |
| 2014/0003000 A1 | 1/2014 | McParlin | |
| 2014/0084432 A1 | 3/2014 | Santos | |
| 2014/0179834 A1* | 6/2014 | Han | C08G 59/3218 523/466 |
| 2014/0264383 A1 | 9/2014 | Kajiwara | |
| 2015/0054180 A1 | 2/2015 | Yoshida | |
| 2015/0179478 A1* | 6/2015 | Xiu | H01L 21/563 257/737 |
| 2016/0172277 A1 | 6/2016 | Lee | |

OTHER PUBLICATIONS

International Search Report and Written Opinion Corresponding to International Application No. PCT/US2015/032425; Date of Mailing: Mar. 14, 2016; 11 Pages.

Campbell et al. "A Wideband Power Amplifier MMIC Utilizing GaN on SiC HEMT Technology", *IEEE Journal of Solid-State Circuits*, vol. 44, No. 10, Oct. 2009, pp. 2640-2647.

\* cited by examiner

OVER-MOLD PLASTIC PACKAGED WIDE BAND-GAP POWER TRANSISTORS AND MMICS

FIELD OF THE DISCLOSURE

The present disclosure relates to wide band-gap semiconductor devices. In particular, the present disclosure relates to over-mold packaged wide band-gap power transistors.

BACKGROUND

As wireless communications standards continue to evolve to provide improvements in data rates and reliability, increasingly stringent requirements are placed on the radio frequency (RF) power amplifiers (PAs) used to transmit wireless signals. RF PAs compliant with the latest wireless communication standards must provide a high degree of linearity and a large gain over a wide bandwidth, while simultaneously being highly efficient in order to preserve the battery life of a mobile terminal in which they are incorporated. Silicon (Si) and gallium arsenide (GaAs) RF PAs are well known and widely used, yet suffer from a relatively narrow bandwidth and a limited output power, characteristics which are inherent in the devices due to the narrow band-gap of their respective material systems. In order to improve the performance of a mobile terminal, wide band-gap semiconductor devices are currently being explored for the amplification of RF signals.

Wide band-gap RF PAs such as those made from silicon carbide (SiC) and gallium nitride (GaN) offer improvements in bandwidth, output power, and efficiency when compared to their narrow band-gap counterparts. However, due to the increased price associated with wide band-gap devices, many mobile device manufacturers continue to rely on conventional RF PAs in the design and manufacture of RF circuitry. While there are many contributing factors to the increased price of wide band-gap semiconductor devices, a large component of the cost is due to the packaging thereof.

FIGS. 1 and 2 show a conventional package 10 for a wide band-gap semiconductor device 12. The conventional package 10 includes a ceramic body 14 and one or more metal contacts 16. Inside the package 10, an air cavity 18 surrounds the wide band-gap semiconductor device 12, which is attached to a metal substrate 20 via a die attach material 22. One or more bond wires 24 couple the wide band-gap semiconductor device 12 to a first metal contact 16A and a second metal contact 16B. The air cavity 18 and the metal substrate 20 dissipate the heat generated by the wide band-gap semiconductor device 12, while simultaneously isolating and protecting the wide band-gap semiconductor device 12 from the outside environment. Although suitable for protecting even a wide band-gap semiconductor device and dispersing the heat generated therefrom, the ceramic body 14 and the metal substrate 20 of the conventional package 10 are expensive to manufacture, thereby driving up the cost of electronics packages including wide band-gap semiconductor devices.

SUMMARY

The present disclosure relates to over-mold packaged wide band-gap power transistors. In one embodiment, a transistor package includes a lead frame, a wide band-gap transistor attached to the lead frame, and an over-mold surrounding the lead frame and the wide band-gap transistor. The wide band-gap transistor has a peak output power greater than 150 W when operated at a frequency up to 3.8 GHz. Using an over-mold along with a wide band-gap transistor in the transistor package allows the transistor package to achieve an exceptionally high gain and bandwidth, while keeping the manufacturing cost of the transistor package low.

According to one embodiment, the wide band-gap transistor is a gallium nitride (GaN) transistor. In yet another embodiment, the wide band-gap transistor is a GaN on silicon carbide (SiC) transistor, and further may be a high electron mobility transistor (HEMT)

According to one embodiment, the efficiency of the transistor package is greater than about 30% measured under a typical wireless communications standard signal, such as a Long Term Evolution (LTE) signal, where the peak to average ratio is about 7.5 dB.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
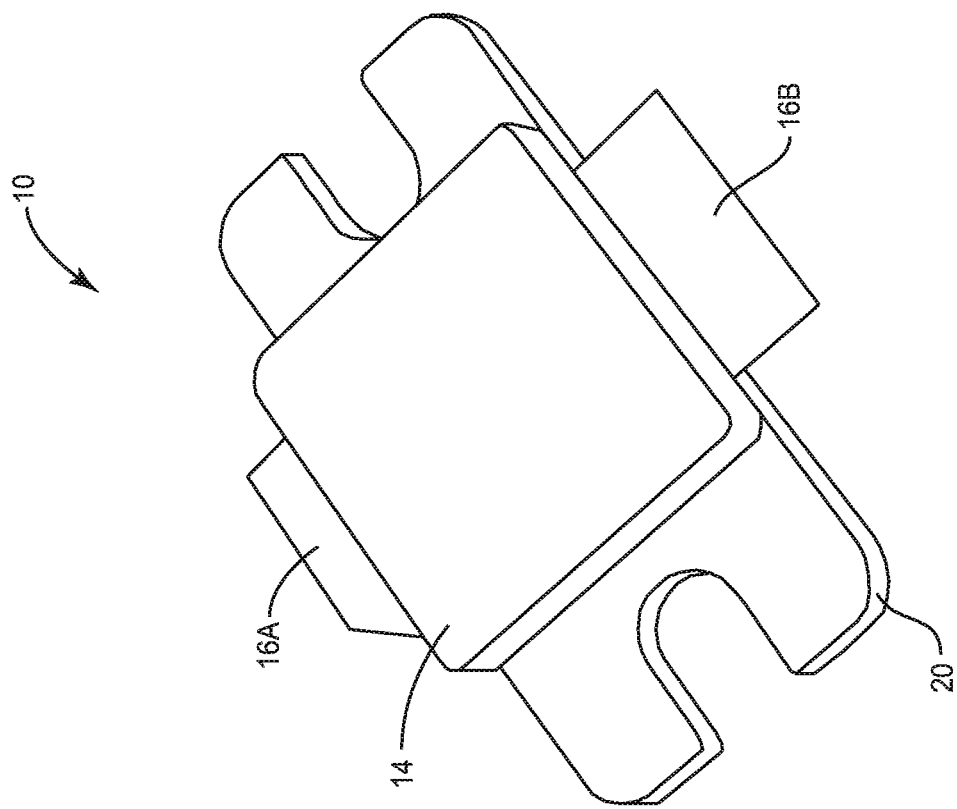
FIG. 1 is an isometric view of a conventional electronics package for a semiconductor device.
Figure 2:
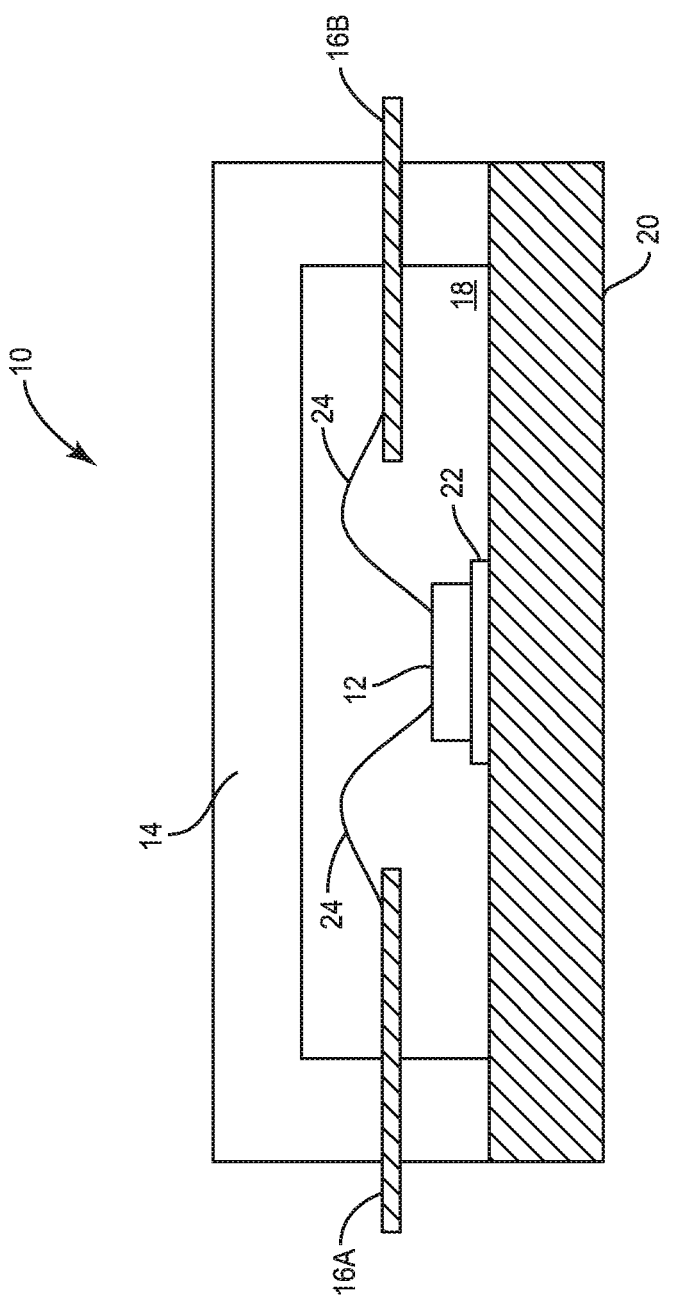
FIG. 2 is a cross-sectional view of the conventional electronics package for a semiconductor device shown in FIG. 1.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
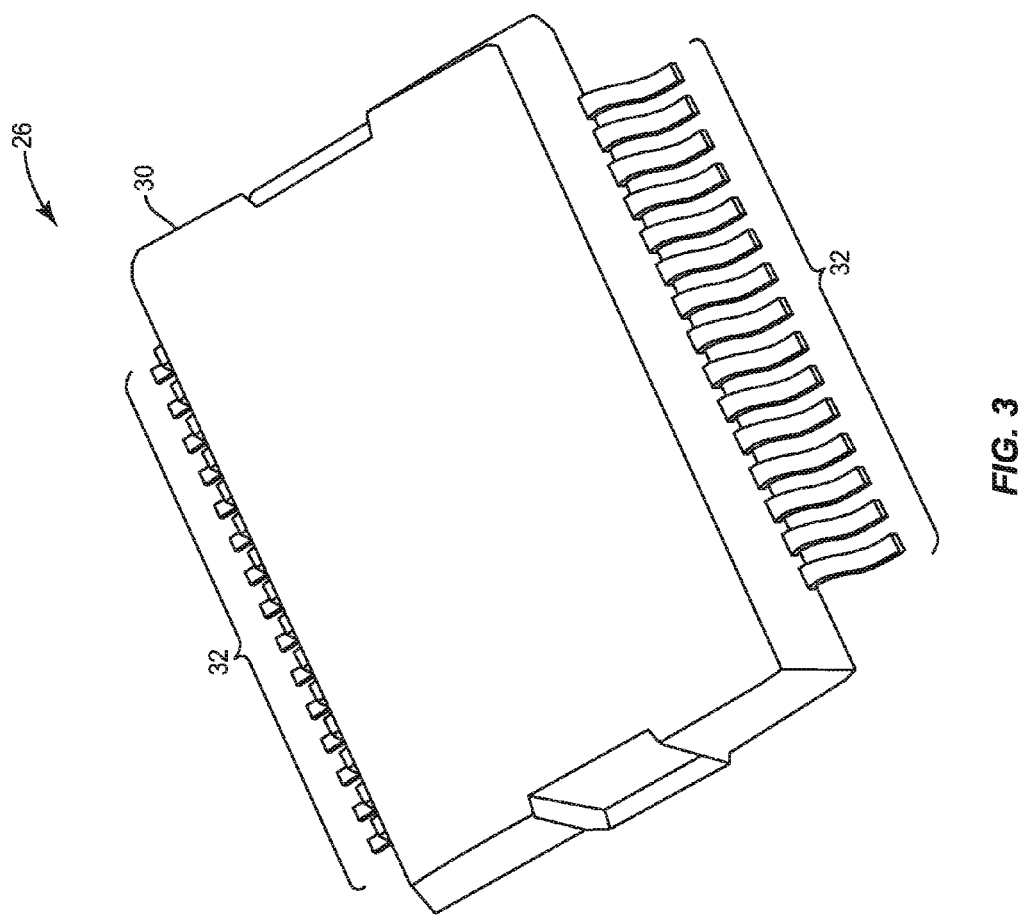
FIG. 3 is an isometric view of an electronics package for a wide band-gap semiconductor device according to one embodiment of the present disclosure.
Figure 4:
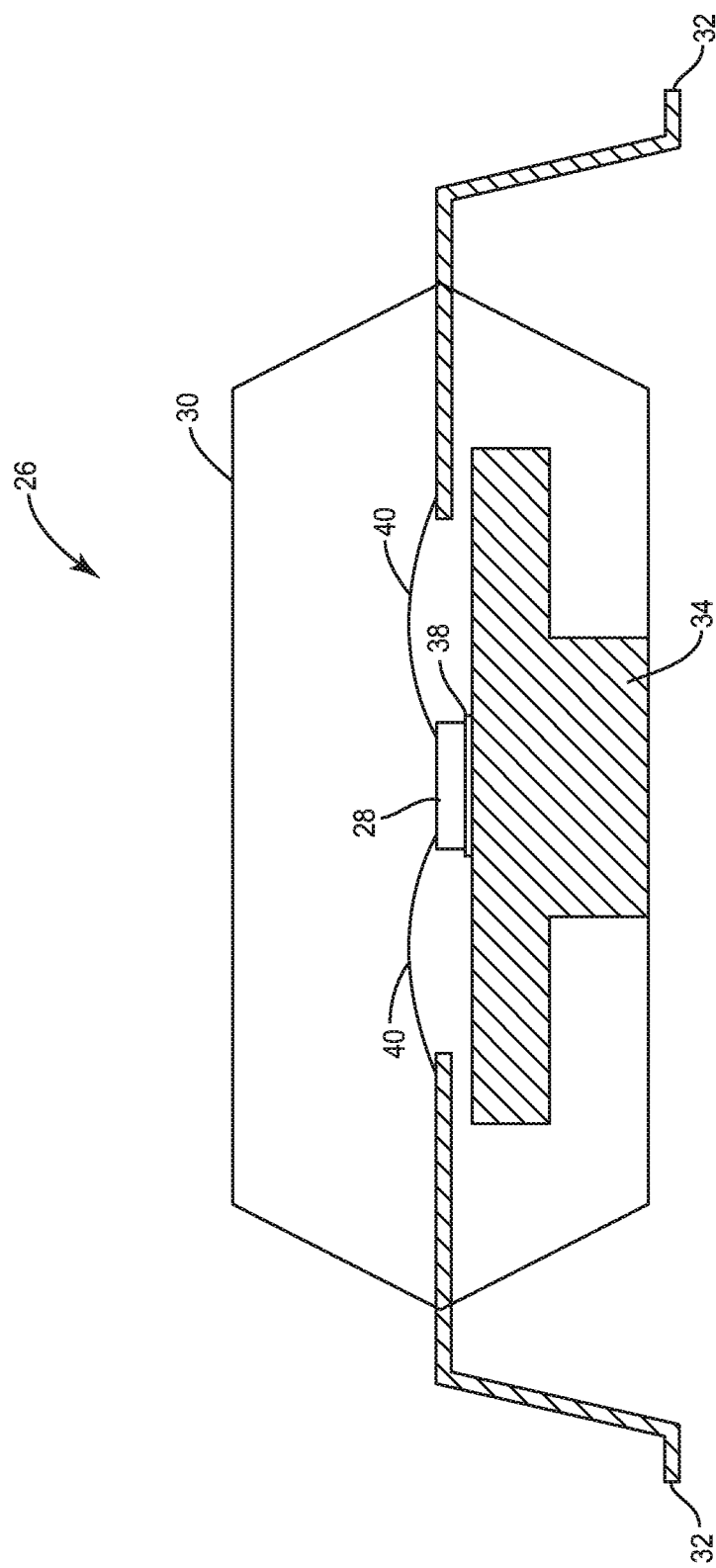
FIG. 4 is a cross-sectional view of the electronics package shown in FIG. 3 according to one embodiment of the present disclosure.

FIGS. 3 and 4 show an electronics package 26 suitable for use with one or more wide band-gap semiconductor devices 28 according to one embodiment of the present disclosure. Specifically, FIG. 3 shows an isometric view of the electronics package 26, while FIG. 4 shows a cross-sectional view of the electronics package 26. The electronics package 26 includes an over-mold 30, one or more input/output pins 32, and a lead frame 34. The over-mold 30 may substantially surround the one or more wide band-gap semiconductor devices 28, which are mounted on the lead frame 34 using a die attach material 38. The over-mold 30 may be formed of a plastic or a plastic polymer compound, which is injection molded around the lead frame 34 and the one or more wide band-gap semiconductor devices 28, thereby providing protection from the outside environment. The one or more wide band-gap semiconductor devices 28 may be coupled to the one or more input/output pins 32 via bond wires 40.

The maximum temperature rating of conventional electronics packaging technologies using an over-mold have been capped at 150° C. due to the materials used in the conventional electronics packaging. Accordingly, conventional electronics packaging technologies are generally suitable only for narrow band-gap devices with a peak output power less than 150 W and a frequency of operation less than 2.2 GHz. Due to the inherently high power density of wide band-gap devices, the packaging of a wide band-gap device is subject to far more stringent requirements than the packaging of a similar narrow band-gap device. Specifically, the high power density of a wide band-gap semiconductor device results in a large amount of heat generated by the device, which must be properly dissipated by the packaging in order to avoid damage to the device. Further, due to the large amount of heat produced, the portion of the packaging in contact with a wide band-gap semiconductor device should avoid excessive expansion and/or contraction when heated and cooled, as this can damage the one or more devices in contact with the packaging.

Since wide band-gap semiconductor devices often operate at a peak output power greater than 200 W, frequencies up to 3.8 GHz, and temperatures greater than 200° C., conventional electronics packaging technologies are thus not suitable for wide band-gap devices rated at their full capacity. In designing an electronics package suitable for a wide band-gap semiconductor device, the inventors discovered four key characteristics for determining the suitability of a material used for the over-mold 30. Specifically, the inventors discovered that the glass transition temperature ($T_G$), the flexural modulus ($F_M$), the coefficient of thermal expansion (CTE), and the moisture absorption rate ($A_R$) of the material used for the over-mold 30 are essential to the performance and longevity of the electronics package 26.

The glass transition temperature ($T_G$) of a material indicates the temperature at which a state change from a solid to a liquid begins to occur, and is often used by electronics packaging designers to characterize the thermal capabilities of the material. The flexural modulus ($F_M$) of a material is the ratio of stress to strain in the flexural deformation of the material (e.g., the tendency for the material to bend). The coefficient of thermal expansion (CTE) of a material indicates how much a material changes in size as a result of changes in temperature of the material. Finally, the moisture absorption rate ($A_R$) of a material indicates the amount (as a percentage) of moisture that a material will absorb under specified conditions.

Generally, an increase in the glass transition temperature ($T_G$) of a given material will allow the material to be exposed to a greater temperature without damage to the structure of the material. However, as the glass transition temperature ($T_G$) of a material increases, so do the flexural modulus ($F_M$), the coefficient of thermal expansion (CTE), and the moisture absorption rate ($A_R$) of the material. In the course of designing the electronics package 26, the inventors discovered that using materials with a high flexural modulus ($F_M$), coefficient of thermal expansion (CTE), and/or moisture absorption rate ($A_R$) for the over-mold 30 may result in delamination of the over-mold 30 from the lead frame 34 and/or ripping, tearing, or other structural damage to the one or more wide band-gap semiconductor devices 28 in contact with the over-mold 30 due to expansion and contraction of the over-mold 30 as the temperature of the one or more wide band-gap semiconductor devices 28 changes over time. Accordingly, a balance must be struck between the glass transition temperature ($T_G$), the flexural modulus ($F_M$), the coefficient of thermal expansion (CTE), and the moisture absorption rate ($A_R$) of the material used for the over-mold 30.

In one embodiment, the over-mold 30 of the electronics package 26 may have a glass transition temperature ($T_G$) between about 135° C. and 400° C., a flexural modulus ($F_M$) below about 20 GPa, a coefficient of thermal expansion (CTE) below about 50 ppm/° C. at temperatures above the glass transition temperature and below about 18 ppm/° C. at temperatures below the glass transition temperature, and a moisture absorption rate ($A_R$) less than about 0.5%. In one embodiment, the over-mold 30 is formed from part no. G720A manufactured by Sumitomo Bakelite of Fukuoka, Japan, the data sheet of which is herein incorporated by reference in its entirety. By using an over-mold 30 for the electronics package 26 with a glass transition temperature ($T_G$) between about 135° C. and 400° C., a flexural modulus ($F_M$) below about 20 GPa, a coefficient of thermal expansion (CTE) below about 50 ppm/° C. at temperatures above the glass transition temperature and below about 18 ppm/° C. at temperatures below the glass transition temperature, and a moisture absorption rate ($A_R$) less than about 0.5%, the electronics package 26 may be suitable for housing the one or more wide band-gap semiconductor devices 28. Specifically, the high glass transition temperature ($T_G$) of the over-mold 30 allows the electronics package 26 to handle the heat produced by the one or more wide band-gap semiconductor devices 28 within the electronics package 26 without structural damage thereto, while the low flexural modulus ($F_M$), coefficient of thermal expansion (CTE), and moisture absorption rate ($A_R$) of the over-mold 30 prevent damage to the one or more wide band-gap semiconductor devices 28 that may be caused due to deformation of the portion of the over-mold 30 in contact with the one or more wide band-gap semiconductor devices 28 due to thermal expansion and/or contraction.

In addition to the characteristics discussed above with respect to the over-mold 30, the inventors also made similar discoveries with respect to the die attach material 38. Specifically, the inventors discovered that the bulk thermal conductivity ($K_T$) and the flexural modulus ($F_M$) of the die attach material 38 are essential to the performance and longevity of the electronics package 26. The die attach material 38 may be a sintered material, such as a sintered silver material with a bulk thermal conductivity ($K_T$) between about 40 W/m-K and 200 w/m-K, and a flexural modulus ($F_M$) less than about 20 GPa. In one embodiment, the die attach material 38 is part no. D591-3B manufactured by Alpha Advanced Materials of Suwanee, Ga., the data sheet of which is herein incorporated by reference in its entirety. By using a die attach material 38 for the electronics package 26 with a bulk thermal conductivity ($K_T$) between about 40 W/m-K and 200 W/m-K, and a flexural modulus ($F_M$) less than about 20 GPa, the electronics package 26 may be suitable for housing the one or more wide band-gap semiconductor devices 28. Specifically, the high bulk thermal conductivity ($K_T$) of the die attach material 38 ensures that adequate heat is conducted away from the one or more semiconductor devices 28, while the low flexural modulus ($F_M$) of the die attach material 38 prevents damage to the one or more wide band-gap semiconductor devices 28 that may be caused due to deformation of the portion of the die attach material 38 in contact with the one or more wide band-gap semiconductor devices 28 due to thermal expansion and/or contraction.

In the course of designing the electronics package 26, the inventors further discovered that upper bound of the flexural modulus ($F_M$) of the die attach material 28 may depend on the area of the one or more wide band-gap semiconductor devices 28 in the electronics package 26. Accordingly, the particular material chosen for the die attach material 28 may change depending on the area of the one or more wide band-gap semiconductor devices 28 in the electronics package 26. In one embodiment wherein the one or more wide band-gap semiconductor devices 28 have an area less than 4 mm×4 mm, the flexural modulus ($F_M$) of the die attach material 28 may be less than about 6 GPa. In an additional embodiment wherein the one or more wide band-gap semiconductor devices 28 have an area less than 2 mm×2 mm, the flexural modulus ($F_M$) of the die attach material 28 may be less than about 10 GPa. In yet an additional embodiment wherein the one or more wide band-gap semiconductor devices 28 have an area less than 1 mm×1 mm, the flexural modulus ($F_M$) of the die attach material 28 may be less than about 20 GPa. Similarly, the upper bound of the flexural modulus ($F_M$), the coefficient of thermal expansion (CTE), and the moisture absorption rate ($A_R$) of the over-mold 30 may change depending on the area of the one or more wide band-gap semiconductor devices 28 in the electronics package 26.

The input/output pins 32 and the lead frame 34 may be copper, copper alloy, or the like, however, any suitable materials for the input/output pins 32 may be used without departing from the principles of the present disclosure.

Notably, using the electronics package 26 with the characteristics discussed above allows for the accommodation of one or more wide band-gap semiconductor devices 28 while significantly reducing the manufacturing cost of the electronics package 26. Because the packaging of wide band-gap devices is a large component of the cost thereof, using the electronics package 26 may significantly reduce the cost of electronics packages that use wide band-gap devices. Further, due to the characteristics discussed above with respect to the electronics package 26, the one or more wide band-gap semiconductor devices 28 may operate at full capacity, without being de-rated due to their packaging. In one embodiment, the one or more wide band-gap semiconductor devices 28 are wide band-gap transistors configured to operate with a peak output power around 150 W at a frequencies above 2.2 GHz and up to 3.8 GHz. In another embodiment, the one or more wide band-gap semiconductor devices 28 are wide band-gap transistors configured to operate with a peak output power around 200 W at a frequency up to 3.8 GHz. In yet another embodiment, the one or more wide band-gap semiconductor devices 28 are wide band-gap transistors configured to operate with a peak output power around 250 W at a frequency up to 3.8 GHz.

In one embodiment, the electronics package 26 meets moisture sensitivity level (MSL-3) and Joint Electron Device Engineering Council (JEDEC) environmental standards.

Figure 5:
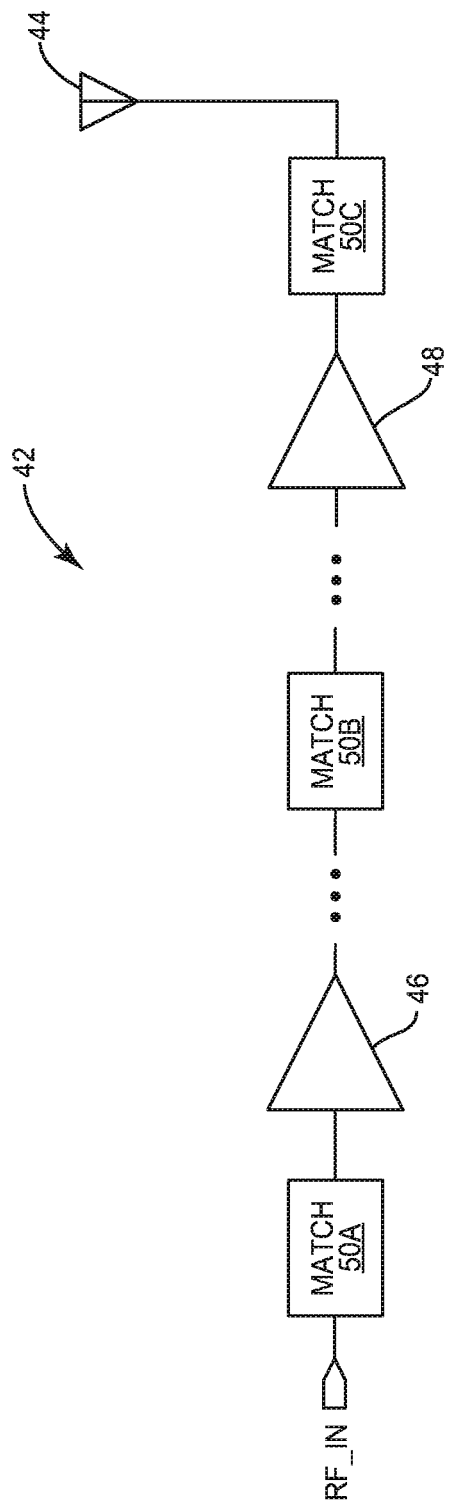
FIG. 5 is a schematic illustrating a radio frequency (RF) transmit chain according to one embodiment of the present disclosure.

FIG. 5 shows a radio frequency (RF) transmit chain 42 according to one embodiment of the present disclosure. The RF transmit chain 42 includes an input node RF_IN, an antenna 44, an input stage RF power amplifier (PA) 46, an output stage RF PA 48, and multiple matching networks 50. Specifically, the RF transmit chain 42 includes a first matching network 50A coupled between the input node RF_IN and the input stage RF PA 46, a second matching network 50B coupled between the input stage RF PA 46 and the output stage RF PA 48, and a third matching network 50C coupled between the output stage RF PA 48 and the antenna 44. In operation, a modulated signal is presented at the input node RF_IN, where it is delivered to the input stage RF PA 46 through the first matching network 50A. The modulated signal is amplified by the input stage RF PA 46 and delivered to the output stage RF PA 48 through the second matching network 50B. The output stage RF PA 48 then further amplifies the modulated signal to produce an RF output signal suitable for transmission from the antenna 44, and delivers the RF output signal to the antenna 44 through the third matching network 50C.

The matching networks 50 may be provided to match an impedance between two different components, thereby ensuring the stable operation of the RF transmit chain 42 with minimal losses due to, for example, a high voltage standing wave ratio (VSWR). Although three different matching networks 50 are shown in the RF transmit chain 42, any number of matching networks 50 may be used in the RF transmit chain 42 without departing from the principles of the present disclosure. Further, although only one input stage RF PA 46 and one output stage RF PA 48 are shown in FIG. 5, any number of input stage or output stage RF PAs may be used in the RF transmit chain 42 without departing from the principles of the present disclosure.

As discussed above, the RF transmit chain 42 needs to have a high degree of linearity and a large gain over a wide bandwidth, while simultaneously being highly efficient. Accordingly, the input stage RF PA 46, the output stage RF PA 48, or both may be wide band-gap RF PAs in order to increase the performance of the RF transmit chain 42.

Figure 6A:
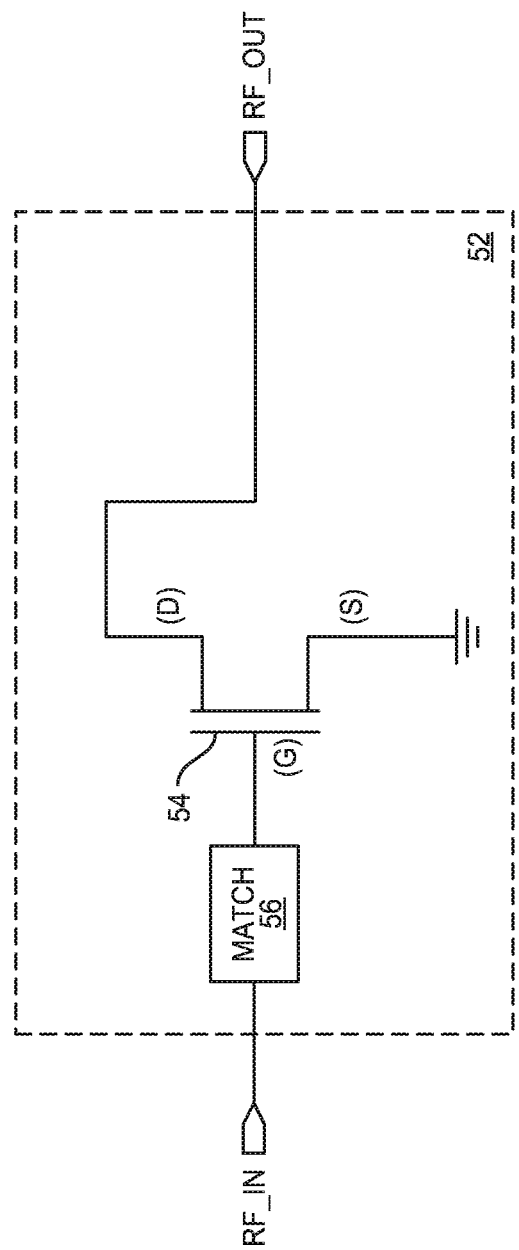
FIGS. 6A-6C are schematics illustrating a transistor package for use in the RF transmit chain shown in FIG. 5 according to one embodiment of the present disclosure.

FIG. 6A shows a transistor package 52 suitable for use as the input stage RF PA 46, the output stage RF PA 48, or both in the RF transmit chain 42 shown in FIG. 5 according to one embodiment of the present disclosure. The transistor package 52 includes an input node RF_IN, a wide band-gap transistor 54, a bandwidth limiting matching network 56, and an output node RF_OUT. The bandwidth limiting matching network 56 is coupled between the input node RF_IN and the wide band-gap transistor 54. The wide band-gap transistor 54 is coupled between the bandwidth limiting matching network 56 and the output node RF_OUT. As discussed above, using the wide band-gap transistor 54 may provide a high degree of linearity and a large gain over a wide bandwidth. In some cases, the bandwidth of the transistor package 52 may be problematic, for example, due to one or more spectral masking requirements (e.g., as mandated by a wireless communication standard with which the transistor package 52 should comply). Accordingly, in order to reduce signal transmissions outside of a predetermined frequency band or bands, the bandwidth limiting matching network 56 is provided in order to attenuate the gain of the wide band-gap transistor 54 when operating outside of the predetermined frequency band or bands. In addition to attenuating the gain of the wide band-gap transistor 54 outside of the predetermined frequency band or bands, the bandwidth limiting matching network 56 may also match an external impedance coupled to the transistor package 52. The details of the bandwidth limiting matching network 56 are discussed in further detail below.

In one embodiment, the wide band-gap transistor 54 is a gallium nitride (GaN) transistor. In an additional embodiment, the wide band-gap transistor 54 is a gallium nitride (GaN) on silicon carbide (SiC) transistor. In other embodiments, any number of wide band-gap semiconductor material systems for the wide band-gap transistor 54 may be used, all of which are contemplated herein. The wide band-gap transistor 54 may be a high electron mobility transistor (HEMT). Accordingly, the bandwidth limiting matching network 56 may be coupled between the input node RF_IN and a gate contact (G) of the wide band-gap transistor 54, the output node RF_OUT may be coupled to a drain contact (D) of the wide band-gap transistor 54, and a source contact (S) of the wide band-gap transistor 54 may be coupled to ground. In other embodiments, the wide band-gap transistor 54 may be a field-effect transistor (FET), a metal-oxide-semiconductor field-effect transistor (MOSFET), a bipolar junction transistor (BJT), an insulated gate bipolar transistor (IGBT), or the like.

The transistor package 52 is an integrated circuit packaged as a discrete component. In other words, the transistor package 52 is suitable as a drop-in replacement for one or more conventional RF PAs. In one embodiment, the transistor package 52 is a monolithic integrated circuit. As referred to herein, a monolithic integrated circuit is an integrated circuit formed on a single semiconductor chip. In an additional embodiment, the transistor package 52 is a hybrid integrated circuit. As referred to herein, a hybrid integrated circuit is an integrated circuit in which multiple inter-connected semiconductor chips are provided on a substrate within a single package. Providing the bandwidth limiting matching network 56 inside of the transistor package 52 allows the transistor package 52 to have a similar frequency response to a conventional, narrow band-gap RF PA, but maintain a higher gain and efficiency while having lower losses than its conventional counterpart. Accordingly, the transistor package 52 may be used as a direct replacement for a conventional RF PA, thereby improving the performance of an RF transmit chain in which the transistor package 52 is incorporated while requiring little to no redesign of the RF circuitry interfacing with the transistor package 52.

In one embodiment, the transistor package 52 is an over-mold package as described above with respect to FIGS. 3 and 4. Accordingly, the transistor package 52 may include a plastic over-mold with a glass transition temperature ($T_G$) between about 135° C. and 400° C., a flexural modulus ($F_M$) below about 20 GPa, a coefficient of thermal expansion (CTE) below about 50 ppm/° C. at temperatures above the glass transition temperature and below about 18 ppm/° C. at temperatures below the glass transition temperature, and a moisture absorption rate ($A_R$) less than about 0.5%. Further, the transistor package 52 may be attached to a lead frame using a die attach material with a bulk thermal conductivity ($K_T$) between about 40 W/m-K and 200 W/m-K, and a flexural modulus ($F_M$) less than about 20 GPa. Accordingly, the cost of the transistor package 52 may be kept low while simultaneously providing the performance improvements discussed above.

In one embodiment, the transistor package 52 has a peak output power greater than 54 dBm (or 250 W) in the predetermined frequency band or bands. Further, due to the bandwidth limiting matching network 56, the transistor package 52 has an average power output less than 48 W outside of the predetermined frequency band or bands. The bandwidth limiting matching network 56 may provide a gain roll-off greater than 0.5 dB within 200 MHz of the predetermined frequency band or bands, and a gain roll-off of 7.5 dB within 300 MHz of the predetermined frequency band or bands. Accordingly, the transistor package 52 may provide more than 240 W of peak output power in the predetermined frequency band or bands, and less than 48 W of average output power outside of the predetermined frequency band or bands, wherein the average output power of the transistor package 52 is measured according to a 7.5 dB peak-to-average ratio (PAR) for WCDMA. Further, the transistor package 52 may provide a peak output power greater than 240 W in the predetermined frequency band or bands, and an average power output less than 48 W outside of the predetermined frequency band or bands, wherein the average output power of the transistor package 52 is defined as the output power of the transistor package 52 when the transistor package 52 is driven at maximum capacity over a 20% duty cycle. In one embodiment, the transistor package 52 may provide an average power output above 80 W at 2.6 GHz with 50 percent drain efficiency while transmitting 7.5 dB PAR Long Term Evolution (LTE) signals at 50V, and have 17 dB of gain at the rated output power. In an additional embodiment, the transistor package 52 may deliver a saturation ($P_{SAT}$) efficiency greater than 65%.

In one embodiment, the predetermined frequency band or bands are frequency bands used for RF communications. Accordingly, the bandwidth limiting matching network 56 may pre-match one or more impedances at the RF frequencies while simultaneously limiting the bandwidth of the wide band-gap transistor 54. In one embodiment, the predetermined frequency band or bands include one or more of the frequencies between 690-960 MHz, 1800-2300 MHz, or 2300-2700 MHz.

Figure 6B:
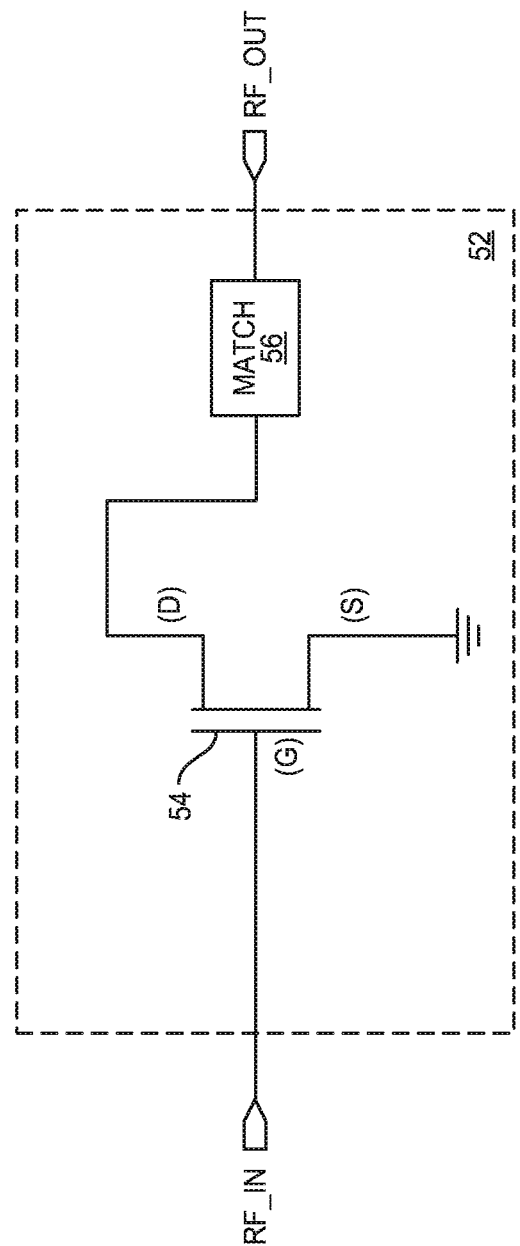

FIG. 6B shows the transistor package 52 according to an additional embodiment of the present disclosure. The transistor package 52 shown in FIG. 6B is similar to the transistor package 52 shown in FIG. 6A, but includes the bandwidth limiting matching network 56 coupled between the wide band-gap transistor 54 and the output node RF_OUT, rather than between the input node RF_IN and the wide band-gap transistor 54. The transistor package 52 may function in a substantially similar manner to the transistor package 52 shown in FIG. 6A. That is, the bandwidth limiting matching network 56 may reduce the gain response of the wide band-gap transistor 54 outside of a predetermined frequency band or bands in order to ensure that the transistor package 52 meets one or more spectral masking requirements.

In one embodiment wherein the wide band-gap transistor 54 is a HEMT, the bandwidth limiting matching network 56 is coupled between the drain contact (D) of the wide band-gap transistor 54 and the output node RF_OUT, the input node RF_IN is coupled to the gate contact (G) of the wide band-gap transistor 54, and the source contact (S) of the wide band-gap transistor 54 is coupled to ground.

Figure 6C:
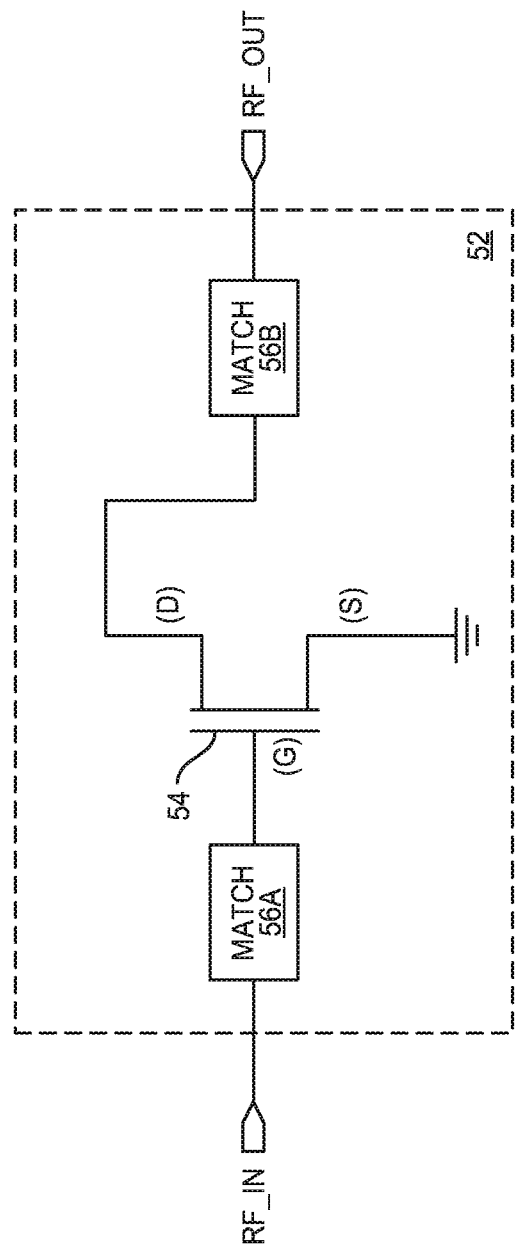

FIG. 6C shows the transistor package 52 according to yet another embodiment of the present disclosure. The transistor package 52 shown in FIG. 6C is similar to the transistor package 52 shown in FIG. 6A and FIG. 6B, but includes both a first bandwidth limiting matching network 56A coupled between the input node RF_IN and the wide band-gap transistor 54 and a second bandwidth limiting matching network 56B coupled between the wide band-gap transistor 54 and the output node RF_OUT. The transistor package 52 may function in a substantially similar manner to the transistor package 52 shown in FIG. 6A and FIG. 6B. That is, the first bandwidth limiting matching network 56A and the second bandwidth limiting matching network 56B may reduce the gain response of the wide band-gap transistor 54 outside of a predetermined frequency band or bands in order to ensure that the transistor package 52 meets one or more spectral masking requirements.

In one embodiment wherein the wide band-gap transistor 54 is a HEMT, the first bandwidth limiting matching network 56A is coupled between the input node RF_IN and the gate contact (G) of the wide band-gap transistor 54, the second bandwidth limiting matching network 56B is coupled between the drain contact (D) of the wide band-gap transistor 54 and the output node RF_OUT, and the source contact (S) of the wide band-gap transistor 54 is coupled to ground.

Figure 7A:
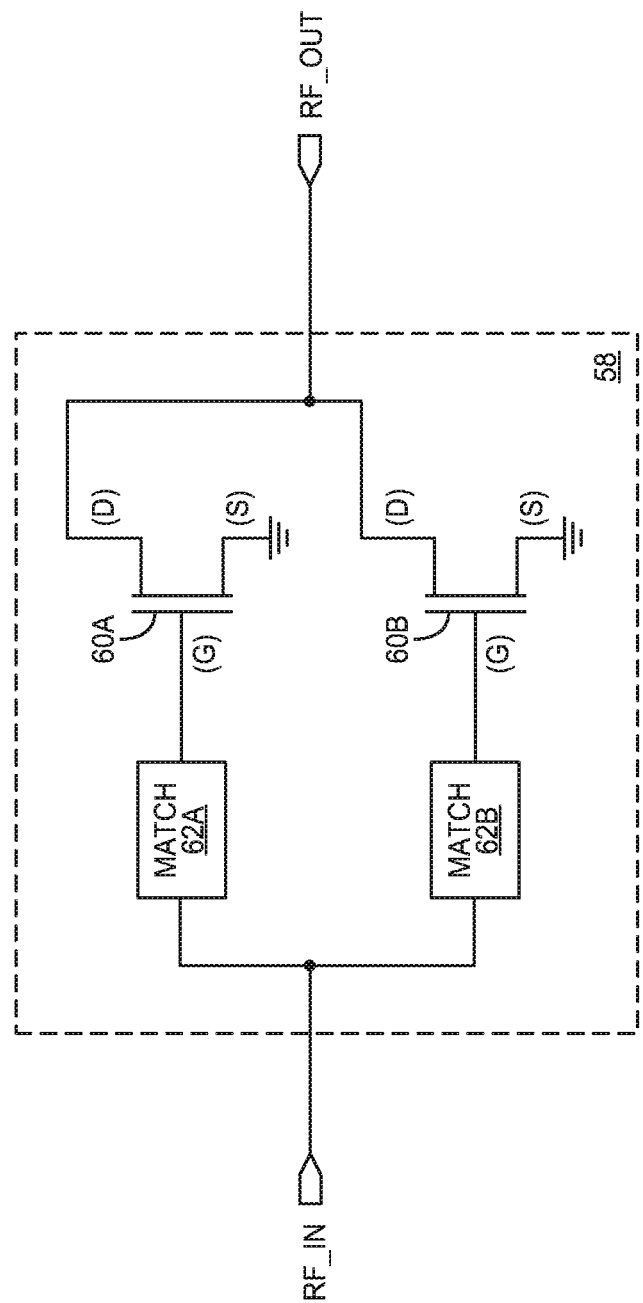
FIGS. 7A-7C are schematics illustrating an amplifier package for use in the RF transmit chain shown in FIG. 5 according to an additional embodiment of the present disclosure.

FIG. 7A shows an amplifier package 58 suitable for use as the input stage RF PA 46, the output stage RF PA 48, or both in the RF transmit chain 42 shown in FIG. 5 according to one embodiment of the present disclosure. The amplifier package 58 includes a first wide band-gap transistor 60A, a second wide band-gap transistor 60B, and one or more bandwidth limiting matching networks 62. The bandwidth limiting matching networks 62 are coupled between an input node RF_IN and the wide band-gap transistors 60. In some embodiments, the first wide band-gap transistor 60A and the second wide band-gap transistor 60B are arranged in a Doherty configuration. Providing multiple wide band-gap transistors 60 in the amplifier package 58 may increase the gain and performance of the amplifier package 58 in some applications. As discussed above, the first wide band-gap transistor 60A and the second wide band-gap transistor 60B may provide a high degree of linearity and a large gain over a wide bandwidth. In some cases, the bandwidth of the amplifier package 58 may be problematic, for example, due to one or more spectral masking requirements. Accordingly, in order to reduce signal transmissions outside of a predetermined frequency band or frequency bands, the bandwidth limiting matching networks 62 are provided in order to attenuate the gain of the first wide band-gap transistor 60A and the second wide band-gap transistor 60B when operating outside of the predetermined frequency band or frequency bands. In addition to attenuating the gain of the first wide band-gap transistor 60A and the second wide band-gap transistor 60B outside of the predetermined frequency band or bands, the bandwidth limiting matching networks 62 may also match an external impedance coupled to the amplifier package 58. The details of the bandwidth limiting matching networks 62 are discussed in further detail below.

In one embodiment, the first wide band-gap transistor 60A and the second wide band-gap transistor 60B are GaN transistors. In an additional embodiment, the first wide band-gap transistor 60A and the second wide band-gap transistor 60B are GaN on SiC transistors. A variety of suitable wide band-gap semiconductor materials systems for the first wide band-gap transistor 60A and the second wide band-gap transistor 60B exist, all of which are contemplated herein. The first wide band-gap transistor 60A and the second wide band-gap transistor 60B may be HEMTs. Accordingly, a first bandwidth limiting matching network 62A may be coupled between the input node RF_IN and a gate contact (G) of the first wide band-gap transistor 60A, a second bandwidth limiting matching network 62B may be coupled between the input node RF_IN and a gate contact (G) of the second wide band-gap transistor 60B, a drain contact (D) of the first wide band-gap transistor 60A may be coupled to the output node RF_OUT, a source contact (S) of the first wide band-gap transistor may be coupled to ground, a drain contact (D) of the second wide band-gap transistor 60B may be coupled to the output node RF_OUT, and a source contact (S) of the second wide band-gap transistor 60B may be coupled to ground. In other embodiments, the first wide band-gap transistor 60A and the second wide band-gap transistor 60B may be FETs, MOSFETs, BJTs, IGBTs, or the like.

In one embodiment, the amplifier package 58 is an integrated circuit packaged as a discrete component. In other words, the amplifier package 58 is suitable as a drop-in replacement for one or more conventional RF PAs. In one embodiment, the amplifier package 58 is a monolithic integrated circuit. In an additional embodiment, the amplifier package 58 is a hybrid integrated circuit. Providing the bandwidth limiting matching network 62 inside of the amplifier package 58 allows the amplifier package 58 to have a similar frequency response to a conventional, narrow band-gap RF PA, but maintain a higher gain and efficiency while having lower losses than its conventional counterpart. Accordingly, the amplifier package 58 may be used as a direct replacement for a conventional RF PA, thereby improving the performance of an RF transmit chain in which the amplifier package 58 is incorporated and requiring little to no redesign of the RF circuitry interfacing with the amplifier package 58.

In one embodiment, the transistor package 52 is an over-mold package as described above with respect to FIGS. 3 and 4. Accordingly, the transistor package 52 may include a plastic over-mold with a glass transition temperature ($T_G$) between about 135° C. and 400° C., a flexural modulus ($F_M$) below about 20 GPa, a coefficient of thermal expansion (CTE) below about 50 ppm/° C. at temperatures above the glass transition temperature and below about 18 ppm/° C. at temperatures below the glass transition temperature, and a moisture absorption rate ($A_R$) less than about 0.5%. Further, the transistor package 52 may be attached to a lead frame using a die attach material with a bulk thermal conductivity ($K_T$) between about 40 W/m-K and 200 W/m-K, and a flexural modulus ($F_M$) less than about 20 GPa. Accordingly, the cost of the transistor package 52 may be kept low while simultaneously providing the performance improvements discussed above.

In one embodiment, the amplifier package 58 has a peak output power greater than 54 dBm (or 250 W) in the predetermined band or predetermined bands. Further, due to the bandwidth limiting matching networks 62, the amplifier package 58 has an average output power less than 48 W outside of the predetermined band or predetermined bands. The bandwidth limiting matching networks 62 may provide a gain roll-off of 0.5 dB within 200 MHz of the predetermined band or predetermined bands, and a gain roll-off of 7.5 dB within 300 MHz of the predetermined band or bands. Accordingly, the amplifier package 58 may provide more than 240 W of peak output power in the predetermined band or predetermined bands, and less than 48 W of average output power outside of the predetermined band or predetermined bands, wherein the average output power of the amplifier package 58 is measured according to a 7.5 dB PAR for WCDMA. Further, the amplifier package 58 may provide a peak output power output greater than 240 W in the predetermined band or predetermined bands, and an average power output less than 48 W outside of the predetermined band or predetermined bands, wherein the average output power of the amplifier package 58 is defined as the output power of the amplifier package 58 when the amplifier package 58 is driven at maximum capacity over a 20% duty cycle. In one embodiment, the amplifier package 58 may provide an average power output above 80 W at 2.6 GHz with 50 percent drain efficiency while transmitting 7.5 dB PAR Long Term Evolution (LTE) signals at 50V, and have 17 dB of gain at the rated output power. In an additional embodiment, the amplifier package 58 may deliver a saturation ($P_{SAT}$) efficiency greater than 65%.

In one embodiment, the predetermined frequency band or bands are frequency bands used for RF communications. Accordingly, the bandwidth limiting matching networks 62 may pre-match one or more impedances at the RF frequencies while simultaneously limiting the bandwidth of the wide band-gap transistors 60. In one embodiment, the predetermined frequency band or bands include one or more of the frequencies between 690-960 MHz, 1800-2300 MHz, or 2300-2700 MHz.

Figure 7B:
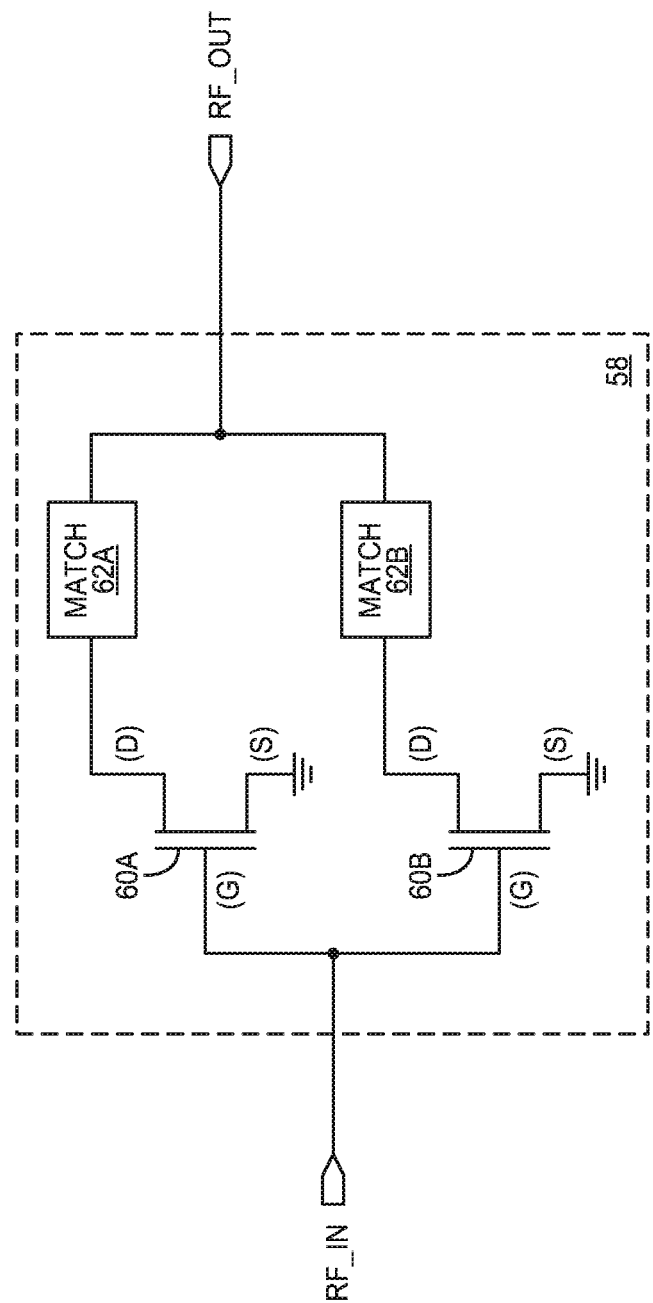

FIG. 7B shows the amplifier package 58 according to an additional embodiment of the present disclosure. The amplifier package 58 shown in FIG. 7B is similar to that shown in FIG. 7A, but includes the bandwidth limiting matching networks 62 coupled between the wide band-gap transistors 60 and the output node RF_OUT, rather than between an input node RF_IN and the wide band-gap transistors 60. The amplifier package 58 may function in a substantially similar manner to the amplifier package 58 shown in FIG. 7A. That is, the bandwidth limiting matching networks 62 may reduce the gain response of the first wide band-gap transistor 60A and the second wide band-gap transistor 60B outside of a predetermined frequency band or bands in order to ensure that the amplifier package 58 meets one or more spectral masking requirements.

In one embodiment wherein the first wide band-gap transistor 60A and the second wide band-gap transistor 60B are HEMTs, the input node RF_IN is coupled to the gate contact (G) of the first wide band-gap transistor 60A and the gate contact (G) of the second wide band-gap transistor 60B, the source contact (S) of the first wide band-gap transistor 60A is coupled to ground, the drain contact (D) of the first wide band-gap transistor 60A is coupled to the output node RF_OUT through the first bandwidth limiting matching network 62A, the drain contact (D) of the second wide band-gap transistor 60B is coupled to the output node RF_OUT through the second bandwidth limiting matching network 62B, and the source contact (S) of the second wide band-gap transistor 60B is coupled to ground.

Figure 7C:
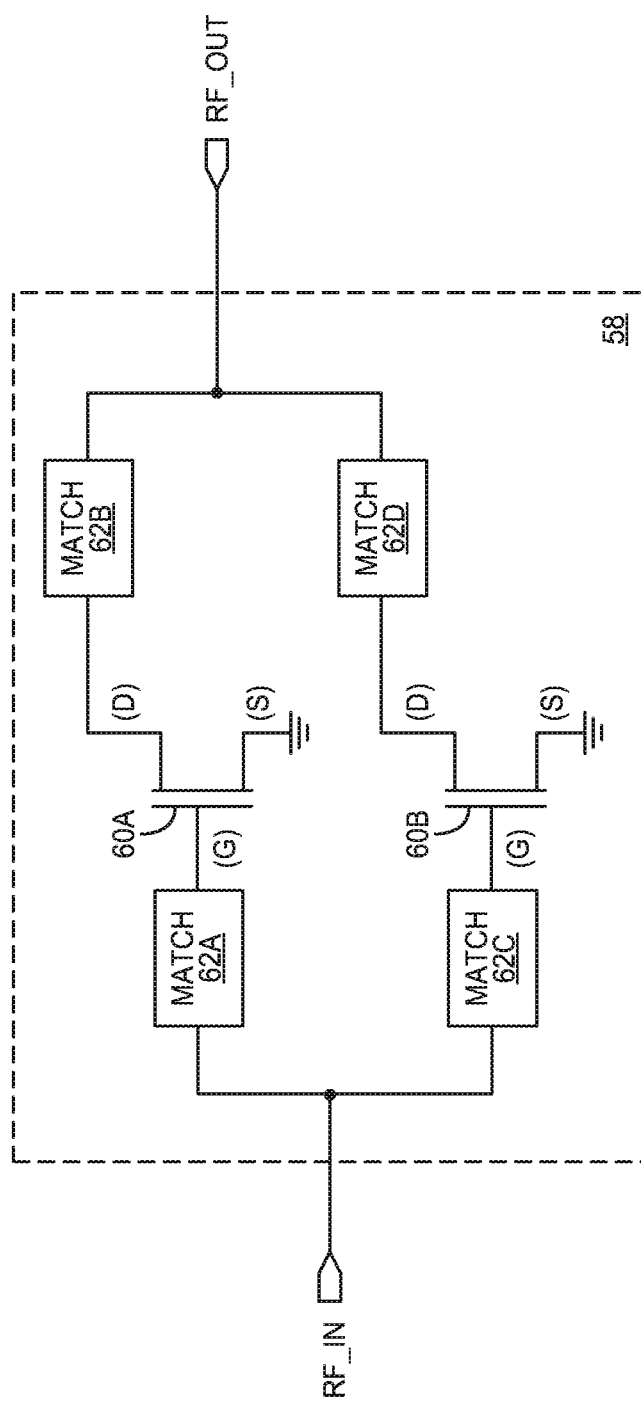

FIG. 7C shows the amplifier package 58 according to yet another embodiment of the present disclosure. The amplifier package 58 shown in FIG. 7C is substantially similar to that shown in FIG. 7A and FIG. 7B, but further includes a third bandwidth limiting matching network 62C and a fourth bandwidth limiting matching network 62D. The amplifier package 58 may function in a substantially similar manner to the amplifier package 58 discussed above with respect to FIGS. 5A and 5B. That is, the bandwidth limiting matching networks 62 may reduce the gain response of the first wide band-gap transistor 60A and the second wide band-gap transistor 60B in order to ensure that the amplifier package 58 meets one or more spectral masking requirements.

In one embodiment wherein the first wide band-gap transistor 60A and the second wide band-gap transistor 60B are HEMTs, the first bandwidth limiting matching network 62A is coupled between the input node RF_IN and the gate contact (G) of the first wide band-gap transistor 60A, the second bandwidth limiting matching network 62B is coupled between the drain contact (D) of the first wide band-gap transistor 60A and the output node RF_OUT, the source contact (S) of the first wide band-gap transistor 60A is coupled to ground, the third bandwidth limiting matching network 62C is coupled between the input node RF_IN and the gate contact (G) of the second wide band-gap transistor 62B, the fourth bandwidth limiting matching network 62D is coupled between the drain contact (D) of the second wide band-gap transistor 60B and the output node RF_OUT, and the source contact (S) of the second wide band-gap transistor 60B is coupled to ground.

Figure 8:
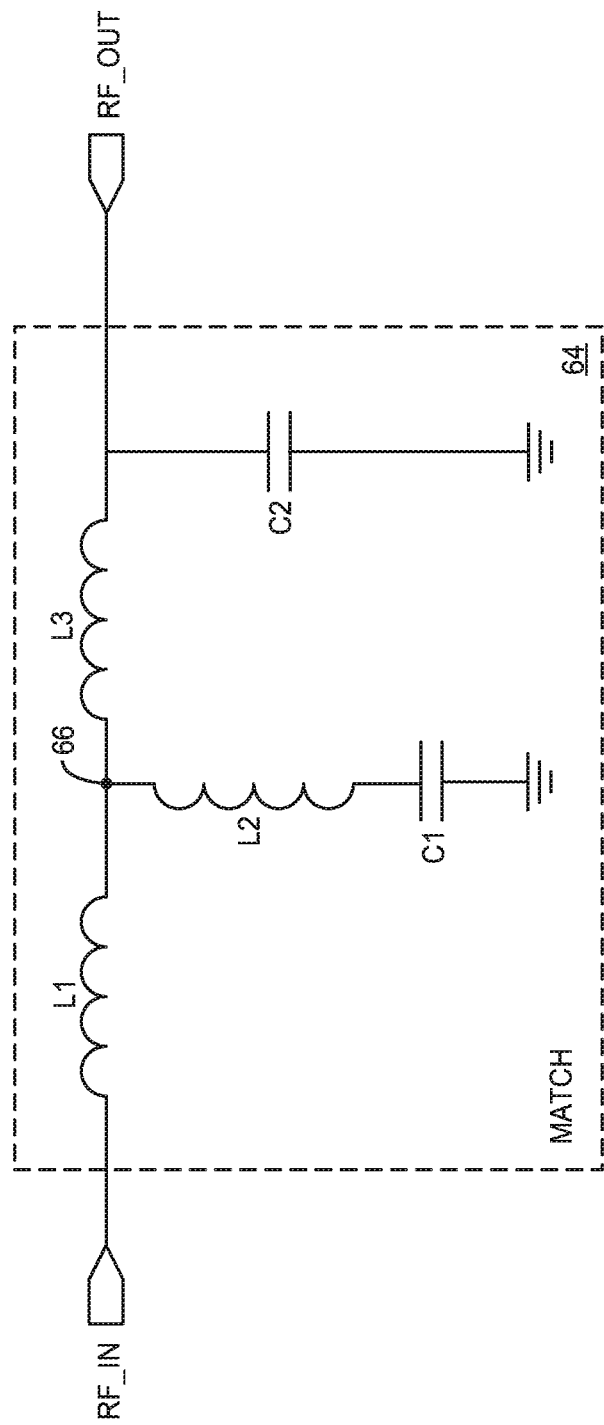
FIG. 8 is a schematic illustrating a bandwidth limiting matching network for use in the transistor package shown in FIGS. 6A-6C and/or the amplifier package shown in FIGS. 7A-7C according to one embodiment of the present disclosure.

FIG. 8 shows an exemplary bandwidth limiting matching network 64, which may be used as the bandwidth limiting matching networks 56 shown in FIGS. 6A-6C and/or the bandwidth limiting matching networks 62 shown in FIGS. 7A-7C according to one embodiment of the present disclosure. The bandwidth limiting matching network 64 includes an input node RF_IN, a first inductor L1 coupled between the input node RF_IN and an intermediate node 66, a second inductor L2 and a first capacitor C1 coupled in series between the intermediate node 66 and ground, a third inductor L3 coupled between the intermediate node 66 and an output node RF_OUT, and a second capacitor C2 coupled between the output node RF_OUT and ground. The second inductor L2 and the first capacitor C1 may act as a notch filter, which may attenuate the gain of an attached component at a predetermined frequency. The predetermined frequency is determined by the inductance and/or capacitance chosen for the various components in the bandwidth limiting matching network 64. The additional components in the bandwidth limiting matching network 64 may match an impedance presented to the input node RF_IN to an impedance presented at the output node RF_OUT in order to reduce interference in the circuit in which the bandwidth limiting matching network 64 is integrated.

Although the bandwidth limiting matching network 64 is shown including a certain number of components arranged in a particular fashion, many different configurations for both the number and arrangement of the components in the bandwidth limiting matching network 64 exist, all of which are contemplated herein. The number and arrangement of the components in the bandwidth limiting matching network 64 may change based on the predetermined frequency band or bands over which a gain response is desired for the transistor package 52 and/or the amplifier package 58.

Figure 9:
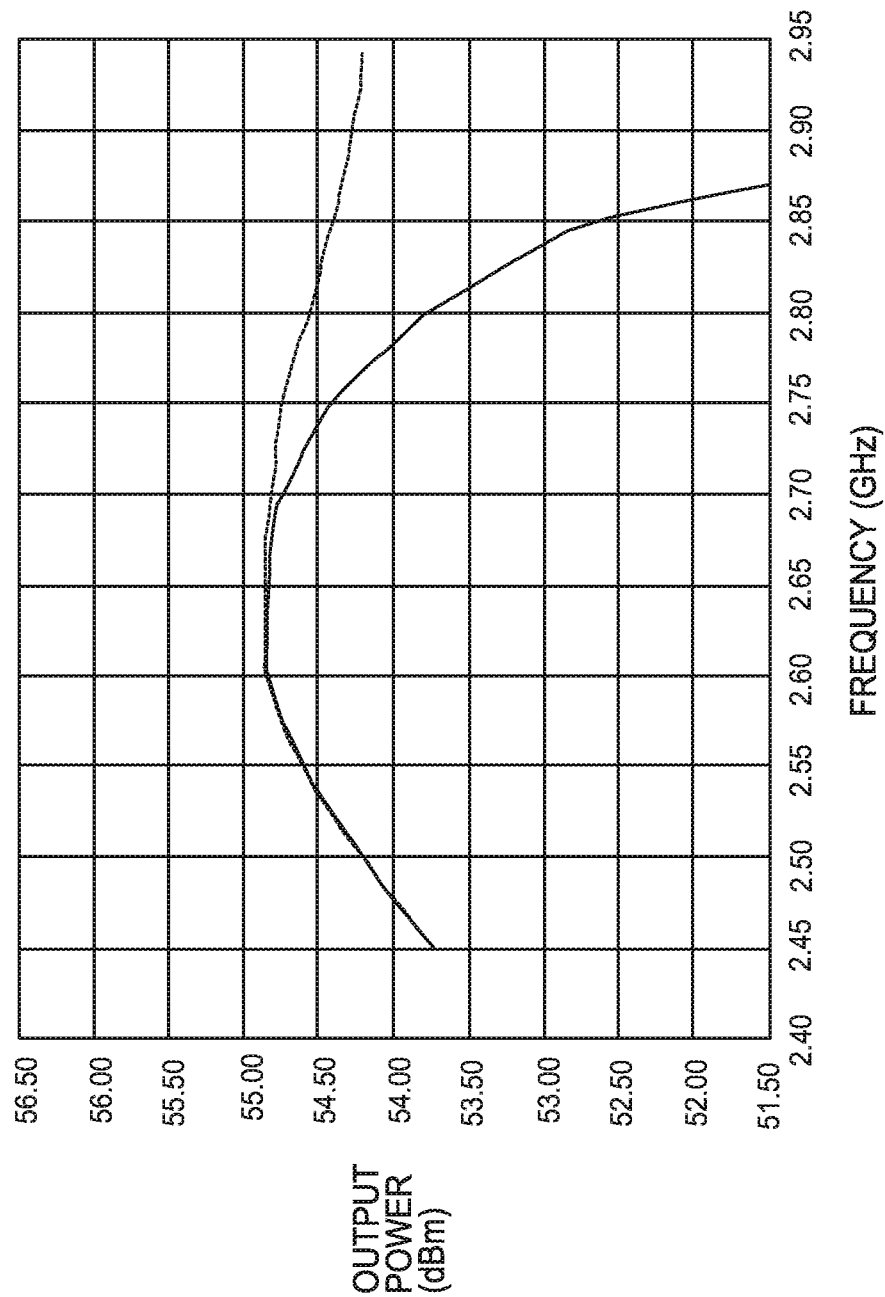
FIG. 9 is a graph illustrating the peak output power response of the transistor package shown in FIGS. 6A-6C and/or the amplifier package shown in FIGS. 7A-7C according to one embodiment of the present disclosure.

FIG. 9 is a graph illustrating the peak output power response of the transistor package 52 shown in FIGS. 4A-4C wherein the predetermined frequency band is between about 2.4 GHz to 2.7 GHz. The solid line in FIG. 9 shows the peak output power response of the transistor package 52 including the bandwidth limiting matching network 56, while the dashed line shows the power response of the transistor package 52 without the bandwidth limiting matching network 56. As shown in FIG. 9, the power response of the transistor package 52 including the bandwidth limiting matching network 56 rolls off at a significantly accelerated rate starting at around 2.7 GHz, while the power response of the transistor package 52 without the bandwidth limiting matching network 56 remains relatively linear. Further, the power of the transistor package 52 is large in the predetermined frequency band, peaking at around 55 dB. Accordingly, the transistor package 52 is easily able to meet one or more spectral masking requirements with a minimal impact on the in-band performance of the transistor package 52.

Those skilled in the art will recognize improvements and modifications to the preferred embodiments of the present disclosure. All such improvements and modifications are considered within the scope of the concepts disclosed herein and the claims that follow.

What is claimed is:

1. A transistor package comprising:
   a lead frame;
   a wide band-gap transistor attached to the lead frame using a sintered metal die attach material, the wide band-gap transistor having a peak output power greater than about 150 W when operated at a frequency up to about 3.8 GHz; and
   an over-mold comprising a plastic or a plastic polymer compound that directly contacts the wide band-gap transistor and that substantially surrounds the lead frame and the wide band-gap transistor.

2. The transistor package of claim 1 wherein the wide band-gap transistor is a gallium nitride (GaN) transistor.

3. The transistor package of claim 1 wherein the wide band-gap transistor is a gallium nitride (GaN) on silicon carbide (SiC) transistor.

4. The transistor package of claim 3 wherein the wide band-gap transistor is a high electron mobility transistor (HEMT).

5. The transistor package of claim 1 wherein the peak output power of the wide band-gap transistor is less than about 1 kW.

6. The transistor package of claim 1 wherein an efficiency of the wide band-gap transistor is greater than about 30%.

7. The transistor package of claim 1 wherein the wide band-gap transistor operates at temperatures greater than 150° C.

8. The transistor package of claim 1 wherein the over-mold has a glass transition temperature greater than about 135° C. and a flexural modulus less than about 20 GPa.

9. The transistor package of claim 8 wherein the over-mold has a thermal coefficient of expansion less than about 50 ppm/° C. at temperatures above the glass transition temperature and a coefficient of thermal expansion less than 18 ppm/° C. at temperatures below the glass transition temperature.

10. The transistor package of claim 9 wherein the over-mold has a moisture absorption rate less than about 0.5%.

11. An over-mold transistor package comprising:
    a lead frame;
    a wide band-gap transistor with a peak output power greater than about 150 W when operated at frequencies above 2.2 GHz and up to about 3.8 GHz on the lead frame;
    an over-mold that comprises a plastic or a plastic polymer compound in contact with a surface of the wide band-gap transistor, on at least a top surface of the lead frame, and extending below the top surface of the lead frame onto at least opposed side surfaces of the lead frame;
    wherein the over-mold has a glass transition temperature greater than about 135° C. and a flexural modulus less than about 20 GPa.

12. The over-mold transistor package of claim 11 wherein the wide band-gap transistor is a gallium nitride (GaN) transistor, and wherein the over-mold substantially surrounds the wide band-gap transistor.

13. The over-mold transistor package of claim 11 wherein the over-mold has a thermal coefficient of expansion less than about 50 ppm/° C. at temperatures above the glass transition temperature and a coefficient of thermal expansion less than 18 ppm/° C. at temperatures below the glass transition temperature.

14. The over-mold transistor package of claim 13 wherein the wide band-gap transistor is a high electron mobility transistor (HEMT).

15. The over-mold transistor package of claim 13 wherein the over-mold has a moisture absorption rate less than about 0.5%.

16. The over-mold transistor package of claim 11 further comprising a die attach material between the lead frame and the wide band-gap transistor, wherein a bulk thermal conductivity ($K_T$) of the die attach material is between about 40 W/m-K and 200 w/m-K, and a flexural modulus ($F_M$) of the die attach material is less than about 20 GPa.

17. The over-mold transistor package of claim 11 wherein the over-mold transistor package is a monolithic integrated circuit.

18. The over-mold transistor package of claim 11 wherein the over-mold transistor package is a hybrid integrated circuit.

19. A transistor package comprising:
a lead frame;
a wide band-gap transistor;
a sintered silver die attach material bonding to the wide band-gap transistor to the lead frame; and
an over-mold comprising a plastic or a plastic polymer compound that directly contacts the wide band-gap transistor and that substantially surrounds the lead frame and the wide band-gap transistor, the over-mold having a glass transition temperature greater than about 135° C. and a flexural modulus less than about 20 GPa.

20. The transistor package of claim 19 wherein the over-mold has a thermal coefficient of expansion less than about 50 ppm/° C. at temperatures above the glass transition temperature and a coefficient of thermal expansion less than 18 ppm/° C. at temperatures below the glass transition temperature.

21. The transistor package of claim 20 wherein the over-mold has a moisture absorption rate less than about 0.5%.

22. The transistor package of claim 19 wherein a bulk thermal conductivity ($K_T$) of the sintered silver die attach material is between about 40 W/m-K and 200 w/m-K, and a flexural modulus ($F_M$) of the sintered silver die attach material is less than about 20 GPa.

23. The transistor package of claim 1 wherein the sintered metal die attach material comprises a sintered silver die attach material.

24. The transistor package of claim 1 wherein a bulk thermal conductivity ($K_T$) of the sintered metal die attach material is between about 40 W/m-K and 200 w/m-K, and a flexural modulus ($F_M$) of the sintered metal die attach material is less than about 20 GPa.

* * * * *